United States Patent [19]
Enomoto et al.

[11] Patent Number: 5,514,628
[45] Date of Patent: May 7, 1996

[54] TWO-STEP SINTER METHOD UTILIZED IN CONJUNCTION WITH MEMORY CELL REPLACEMENT BY REDUNDANCIES

[75] Inventors: Osaomi Enomoto; Yoichi Miyai; Yoshihiro Ogata, all of Ibaraki; Yoshinobu Yoneoka, Abiko, all of Japan

[73] Assignee: Texas Instruments Incorporated, Dallas, Tex.

[21] Appl. No.: 451,644
[22] Filed: May 26, 1995
[51] Int. Cl.⁶ .................................................. H01L 21/324
[52] U.S. Cl. ............................ 437/247; 437/8; 437/52; 437/923
[58] Field of Search ................................ 437/52, 8, 247, 437/923

[56] References Cited

U.S. PATENT DOCUMENTS

| | | | |
|---|---|---|---|
| 3,349,474 | 10/1967 | Rauscher | 437/8 |
| 3,590,477 | 7/1991 | Cheroff | 437/247 |
| 4,113,514 | 9/1978 | Pamlcove et al. | 437/247 |
| 4,151,007 | 4/1979 | Leuimsleim et al. | 437/247 |
| 4,920,077 | 4/1990 | Mora | 437/247 |

OTHER PUBLICATIONS

S. M. Sze, Physics of Semiconductor Devices Second Edition, 1981, pp. 380–395.
E. H. Nicollian and J. R. Brews, MOS (Metal Oxide Semiconductor) Physics and Technology, 1982, pp. 285–295, 774–791, 820–825.

*Primary Examiner*—Tom Thomas
*Attorney, Agent, or Firm*—Rich Donaldson; Leo Heiting; Richard B. Havill

[57] ABSTRACT

A process is disclosed herein for increasing yield in a semiconductor circuity having redundant circuitry for replacing defective normal circuitry in the semiconductor integrated circuit. In the first step, an insufficient sinter operation (50) is carried out in a hydrogen atmosphere at a temperature of less than 350° C. At this temperature, no significant change will be seen in the interface trap density. Thereafter, the integrated circuit is tested (54,56) and the defective normal circuitry then is replaced (58) with the redundant circuitry. The integrated circuit is then subjected to a sufficient sinter operation (64) which is an operation wherein the substrate is disposed at a temperature between 350° C.–500° C. for more than 30 minutes. This sufficient sinter operation is performed in a hydrogen atmosphere, allowing dangling bonds at the interface to be terminated with hydrogen. Preferable, the optimal temperature for the sufficient sinter is approximately 400° C. The integrated circuit is then subjected to a reliability and burn-in procedure.

7 Claims, 2 Drawing Sheets

TWO-STEP SINTER METHOD UTILIZED IN CONJUNCTION WITH MEMORY CELL REPLACEMENT BY REDUNDANCIES

TECHNICAL FIELD OF THE INVENTION

The present invention pertains in general to techniques for improving the yield of a semiconductor circuit, and more particularly, to a technique for improving yield with the use of cell replacement through redundancy.

CROSS REFERENCE TO RELATED APPLICATIONS

This application is related to U.S. pat. application Ser. No. 08451714, filed concurrently herewith and entitled "FOR UTILIZING A CONCURRENT SINTER DURING THE SILICON NITRIDE PASSIVATION FILM DEPOSITION".

BACKGROUND OF THE INVENTION

As the density of semiconductor circuits in a device increase, the difficulties in processing these circuits also increase, this directly affecting the yield of these devices. One of the highest density circuits presently manufactured is the dynamic random access memory (DRAM) which can include at present up to 64 million memory cells in each device. In this type of device, a plurality of memory cells are arranged in an array of rows and columns. In order for this type of memory device to be functionally usable, all 64 million memory cells must be operational under specified operating conditions. If even a single cell fails, this results in the entire device failing.

In order to increase yield in semiconductor memories, redundant structures are provided on the device allowing replacement of defective portions of the device. This is typically facilitated through the use of some type of fuse programming. This allows replacement of sections of the memory array determined to be defective, such as a column, and also alteration of decoding circuitry. The altered decoding operates to avoid any defective portion of the memory array that is addressed, and instead actually addresses a replacement or redundant portion of the memory. Data is stored in the addressed redundant portion during a WRITE operation and retrieved therefrom during a READ operation.

One problem that has occurred as the density of the memory arrays have increased is failures that occur after the cell replacement and subsequent burn-in. Although the cell replacement results in a memory device that passes the test, subsequent burn-in and reliability testing results in a certain percentage of the devices failing. In the manufacturing process of the semiconductor memory, certain steps are taken to decrease the number of failed cells prior to cell replacement, since there are only a limited number of replacement cells provided on the device. One failure mechanism is high leakage current due to interface trap density. In order to lower the interface trap density and stabilize the operation of the device, the device is subjected to an annealing process (hereinafter referred to as "sinter"). This sinter operation is achieved in an atmosphere of hydrogen at a predetermined temperature for a predetermined duration of time, and typically occurs toward the end of the fabrication process. The effect of the sinter is a reduction of the interface trap density by hydrogen termination which allows hydrogen to be connected to dangling bonds which exist in the semiconductor-oxide ($SiO_2$) boundary/and within crystal defects. Once this is done, certain cells which previously had leakage currents above the specified current level will now fall below that current level and will not have to be replaced. Thereafter, the integrated circuit is packaged and subjected to a reliability test. One problem that exists with this procedure is that, in certain marginal cells, the hydrogen termination that is provided during the sintering operation is broken during the reliability test. This leaved unterminated dangling bonds in the semiconductor-oxide boundary and crystal defects in the memory cell junction. This results in increased leakage current at a level higher than the specified level.

In general, interface traps have been discussed in the literature and can be produced in several different ways: (1) thermal oxidation in dry oxygen or steam, (2) plasma oxidation, (3) avalanche injection of electrons or holes into the $SiO_2$, (4) the diffusion of metals such as chromium to the Si—$SiO_2$ interface, and (5) the exposure of the MOS system to ionizing radiation. There are a number of ways to control interface trap densities, one of which is annealing or sinter. It has been reported in the literature, E. H. Nicollian and J. R. Brews, *MOS Physics and Technology*, Wylie Interscience Publication, pp. 778–787 and 822–824, which reference is incorporated herein by reference, that low temperature post-metallization anneal will cause changes in both the interface trap density and the oxide-fixed charge density. The value of the interface trap density can change with low temperature annealing by up to one order of magnitude. The key agent responsible for a reduction of the interface trap density is the transfer of hydrogen into or out of the oxide layer by performing the low temperature anneal in a hydrogen atmosphere. This low temperature anneal typically provides a connection of a hydrogen atom to a dangling bond. The chemistry by which interface traps are activated and annihilated by hydrogen is generally unknown, but it is believed that the hydrogen attaches to a dangling bond. Thereafter a sealing layer impervious to water and hydrogen, is deposited.

Before annealing, a steam-grown $SiO_2$ layer has a typical interface trap density in the low $10^{11}$ cm$^{-2}$ eV$^{-1}$ range near mid-gap and a dry oxygen-grown $SiO_2$ layer has a typical interface trap density in the low $10^{12}$ cm$^{-2}$ eV$^{-1}$ range near mid-gap. After either a low or high temperature anneal, the interface trap density will be in the low $10^{10}$ cm$^{-2}$ eV$^{-1}$ range near mid-gap. Some of the atomic hydrogen diffuses to the Si—$SiO_2$ interface and chemically reacts with the interface traps, making them electrically inactive.

In general, the interface trap density distribution has been modeled as being produced by a distribution of bond angles or by stretched bonds at the silicon surface. Local strain or local non-stoichiometry at the Si—$SiO_2$ interface could cause these bond distortions. At the interface, the Si and the $SiO_2$ are bonded by an oxygen in a lattice configuration wherein distortion of the Si—O bond angle by as much as 30° is expected to create energy levels near the silicon conduction band edge, while distortion of the Si—Si bond angles in the silicon tends to produce energy levels near the silicon valance band edge. A bond-stretching model utilizes a number of bonds, a Si—O bond at the interface of the plane that causes trap levels at the lower half of the bandgap, stretched Si—Si bonds which cause trap levels in the upper half of the gap, and silicon dangling bonds which produce trap levels near mid-gap. It is the silicon dangling bond that is replaced by a hydrogen termination. This hydrogen termination can be broken during the reliability test procedures, resulting in an increase in interface trap density and leakage current. Subsequently the device fails if it was a marginal device prior to the sinter operation.

SUMMARY OF THE INVENTION

The present invention disclosed and claimed herein comprises a process for increasing the yield of a semiconductor integrated circuit having redundant circuitry for replacing defective circuitry in the semiconductor circuit. The process includes the first step of subjecting the integrated circuit to an insufficient sinter operation. This is performed after formation of the circuitry on the integrated circuit. The insufficient sinter operation is performed at a temperature that will not cause a substantial decrease in the interface trap density in the integrated circuit. Thereafter, the integrated circuit is tested to determine if any of the circuitry on the integrated circuit corresponding to the redundant circuitry is defective. If defective, the defective circuitry is replaced with the corresponding redundant circuitry. Thereafter, the integrated circuit is subjected to a sufficient sinter operation for a predetermined amount of time. The sufficient sinter operation is carried out at a temperature that will substantially decrease the interface trap density. Thereafter, the integrated circuit is subjected to a reliability and burn-in test procedure.

In another aspect of the present invention, the insufficient sinter is carried out at a temperature of less than 350° C. and in a hydrogen atmosphere or, alternately, by reducing the time of sintering or the amount of hydrogen gas flow. The sufficient sinter operation, by comparison, is carried out at a temperature in the range of 350° C.–500° C. in a hydrogen atmosphere. The optimal temperature for the sufficient sinter operation is 400° C.

BRIEF DESCRIPTION OF THE DRAWINGS

For a more complete understanding of the present invention and the advantages thereof, reference is now made to the following description taken in conjunction with the accompanying Drawings in which.

DETAILED DESCRIPTION OF THE INVENTION

Figure 1:
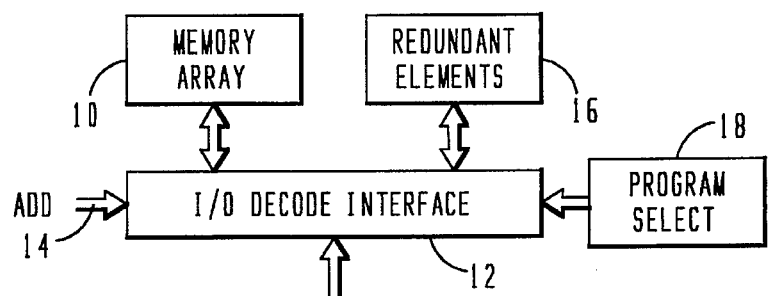
FIG. 1 illustrates a generalized block diagram of a memory array with redundant elements.

Referring now to FIG. 1, there is illustrated a generalized block diagram of a semiconductor memory. In general, the memory includes at the center thereof a memory array 10 which is comprised of a plurality of memory cells arranged in rows and columns. Typically, the memory array receives row addresses and column addresses, with the row addresses activating a Word Line to activate memory cells in a single row with all memory cells in that row accessed. A column address and a column decode circuit select one or more columns for output therefrom. The decode operation is indicated by an input/output I/O interface 12, which receives the address on an address input bus 14. In addition to the memory array 10, there are provided redundant elements 16 which comprise redundant columns, for example. These redundant columns are selectively activated and controlled to replace columns that are determined to be defective in the memory array 10. By activating or selecting these redundant elements, when a defective column is addressed, the I/O decode interface block 12 is controlled by a program select block 18 to select the redundant element. This program select block 18 typically utilizes fuse elements that can be "blown" prior to packaging the device and final test.

Figure 2:
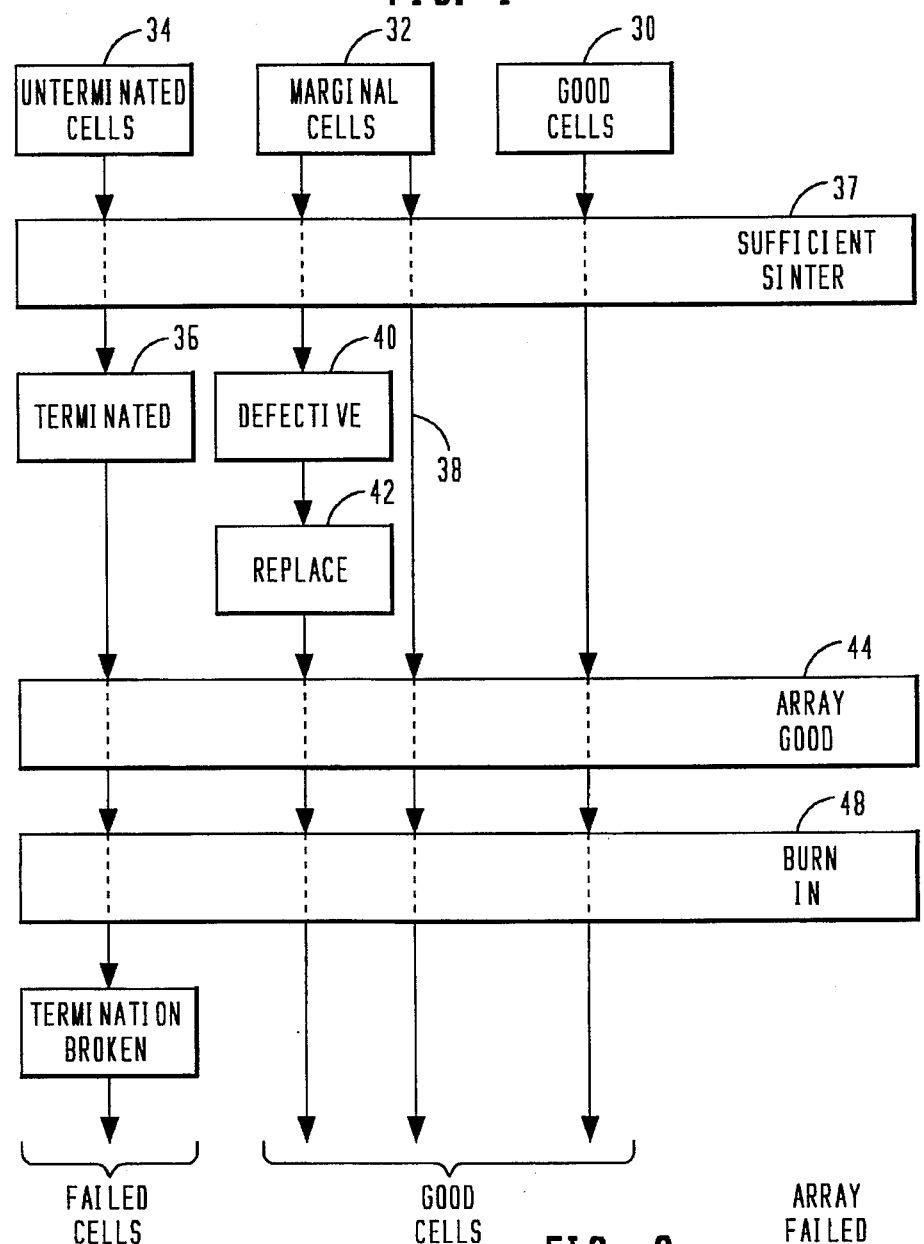
FIG. 2 illustrates a diagrammatic view of a process flow for a prior art process.

Referring now to FIG. 2, there is illustrated a process flow for the prior art technique of performing a sinter to lower the leakage current prior to performing a replacement operation of cells with redundant circuit elements. In this process flow, there are defined three types of cells, good cells, marginal cells and unterminated cells. Good cells are cells that would eventually pass the test regardless of whether a sinter operation were performed, these represented by a block 30. Marginal cells are cells that would fail prior to a sintering operation and, after some level of sinter, would result in a portion of those cells passing and a portion remaining defective, this represented by a block 32. The unterminated cells are cells that have a large number of dangling bonds at the Si—SiO$_2$ interface which, when subjected to a temperature in the range of 350° C.–500° C. in a hydrogen atmosphere, would have the dangling bond attached to a hydrogen atom and would lower the leakage current enough to meet or exceed the specifications but, after a reliability burn-in operation, would result in the hydrogen termination being broken and the current again rising above the specified level to result in a failed cell. This is represented by a block 34.

As can be seen in FIG. 2, the prior art process flow results in all cells in blocks 30, 32 and 34 being passed through a sufficient sinter operation. The sufficient sinter operation is an operation wherein the device is subjected to a temperature in the range of 350° C.–500° C. in a hydrogen atmosphere and held there for a predetermined amount of time, typically 30–60 minutes. This will lower the leakage current in some of the marginal cells 32 such that they will no longer be defective and will also terminate the dangling bond in the pre-sinter unterminated cells in the block 34. The sufficient sinter operation is illustrated by the process flow of Table 1:

TABLE 1

| STEP | SET GAS FLOW/MINUTE | | SET TIME | SET TEMP |
|---|---|---|---|---|
| | N2 | H2 | | |
| STANDBY | 3 L | — | — | 450° C. |
| LOAD | 35 L | — | — | 450° C. |
| PURGE | 10 L | — | 10 MIN | 450° C. |
| SINTER | — | >10 L | >30 MIN | 350°–500° C. |
| RAMP DOWN | — | >10 L | — | 250° C. |
| PURGE | 10 L | — | 10 MIN | 250° C. |
| UNLOAD | 35 L | — | — | 250° C. |
| COOLING | 35 L | — | 20 MIN | 250° C. |

As can be seen in Table 1, the sufficient sinter operation is performed in a hydrogen atmosphere with a flow rate of greater than 10 liters per minute and the time is greater than 30 minutes with a temperature set between 350° C.–500° C. This is what is referred to as a low temperature post-metallization anneal. This is a low conventional anneal. After the sufficient sinter operation, the pre-sinter unterminated cells 34 will now constitute good cells since they will now have the dangling bonds terminated with hydrogen atoms, as indicated by a block 36. Further, some of the marginal cells 32 will have been changed from defective cells to good cells, as indicated by a path 38, and the other marginal cells will have been tested to be defective, as indicated by block 40. The tested defective cells will then be replaced by redundant cells on the chip, as indicated by a block 42. This will result in the good cells from the block 30, the cells which have their leakage current lowered below the specification from the marginal cell block 32 along path 38, and the replacement cells of block 42, in addition to the unterminated cells in block 34, having their hydrogen bonds terminated. This will result in the array being tested as good, in a block 44. The array will then be subjected to a reliability and burn-in procedure, as represented by a block 48. After this burn-in, the unterminated cells noted in block 34, will have the hydrogen termination broken, leaving the dangling bonds in a semiconductor-insulation film boundary and crystal defects in the memory cell junction. This will generate leakage current higher than the specification. Since the cell replacement has already been performed and the chip typically packaged, this now results in a failed part during final testing. This is due to the fact that the cell that was defective and rendered non-defective only by termination of the dangling bonds with hydrogen, in such a manner, that burn-in would later break the bond and recreate a dangling bond. These recreated dangling bonds may occur in one call or only a few cells. Its final testing is noted that only one failed cell renders a memory part defective during final testing. This defect, although minimal, affects the yield of the progress and is the defect that is addressed by the present invention.

Figure 3:
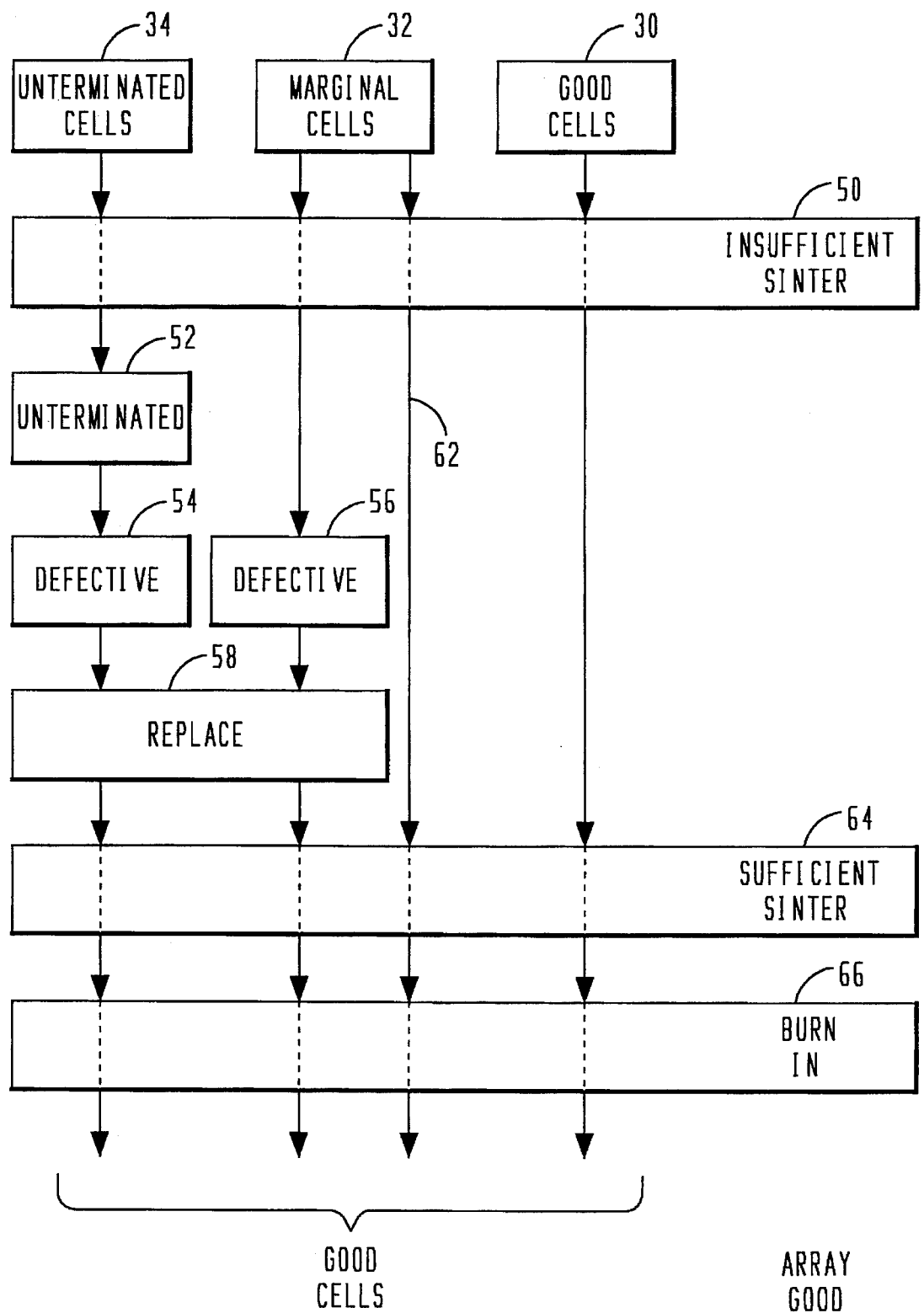
FIG. 3 illustrates a process flow for the method of sintering of the present invention.

Referring now to FIG. 3, there is illustrated a process flow for the two-step sinter method of the present invention. In the present invention, the device and therefore the unterminated cells of the block 34, the marginal cells of the block 32 and the good cells of the block 30 are first subjected to an insufficient sinter. The insufficient sinter is similar to the sufficient sinter with the exception that the substrate is subjected to the hydrogen atmosphere for a period of less than thirty minutes with a flowrate of less than ten liters per minute and at a temperature that is either less than 350° C. or greater than 500° C., and therefore outside the range that will reduce the interface trap level density. This insufficient sinter temperature will be outside of the limits of a post-metallization low-temperature anneal. The steps for the insufficient sinter are illustrated in Table 2, it being noted that this is an operation that produces results somewhere between the results of a "no sinter" operation and a "sinter" operation.

TABLE 2

| STEP | SET GAS FLOW/MINUTE | | SET TIME | SET TEMP |
| --- | --- | --- | --- | --- |
| | N2 | H2 | | |
| STANDBY | 3 L | — | — | 450° C. |
| LOAD | 35 L | — | — | 450° C. |
| PURGE | 10 L | — | 10 MIN | 450° C. |
| SINTER | — | <10 L | <30 MIN | <350° or >500° C. |
| RAMP DOWN | — | <10 L | — | 250° C. |
| PURGE | 10 L | — | 10 MIN | 250° C. |
| UNLOAD | 35 L | — | — | 250° C. |
| COOLING | 35 L | — | 20 MIN | 250° C. |

Further, the insufficient sinter operation can be carried out at a lower gas level flow and in a much shorter time than those used for a sufficient sinter operation.

After the insufficient sinter, as indicated by a block 50, the unterminated cells in block 34 remain unterminated, as indicated by a block 52. These will, therefore, be defective cells, which by definition of the unterminated cells are cells that are only rendered non-defective by termination of dangling bonds which again become unterminated during burn-in and cause leakage current above the specified level. The defective unterminated cells are indicated by a block 54. Other defective cells are indicated by a block 56 which originated from the marginal cell block 52. These defective cells are then replaced by redundant cells, as indicated by block 58. In addition, there are in the marginal cell block 32, a small number of cells, which have their leakage current lowered sufficiently by the insufficient sinter operation, as indicated by a path 62, that they do not have to be replaced. However, the insufficient sinter may be of such a nature that the marginal cells all remain defective. In any event, it is the cells from the unterminated cell block 34 that remain deflective during the insufficient sinter operation 50. If those unterminated cells were subjected to a sufficient sinter, rather than the insufficient sinter, they would test good following the sinter and fail after burn-in.

After a replacement of defective cells by redundant cells operation in the block 58, all of the cells are subjected to a sufficient sinter operation, indicated by block 64, this being the sufficient sinter operation described above with respect to Table 1 in that the sinter operation is performed in a hydrogen atmosphere with a flow rate of greater than ten liters per minute of hydrogen at a temperature between 350° C.–500° C. After this operation, the device is packaged and then subjected to a reliability and burn-in process, as indicated by block 66. This will result in a good array or, more precisely, it will not fail due to marginal cells rendered good by the sufficient sinter and later failing at reliability testing, as in the prior art process. This operation basically has caught the unterminated cells 34 which were defective prior to a sufficient sinter operation but which cells are rendered non-defective by the prior art sufficient sinter operation and later become defective due to the breaking of the terminations of the dangling bonds during burn-in.

Although the preferred embodiment has been described in detail, it should be understood that various changes, substitutions and alterations can be made therein without departing from the spirit and scope of the invention as defined by the appended claims.

What is claimed is:

1. A process for increasing yield in a semiconductor integrated circuit having normal circuitry and redundant circuitry for replacing defective normal circuitry in the semiconductor circuit, the process comprising the steps of:

after formation of the circuitry on the integrated circuit, subjecting the integrated circuit to an insufficient sinter operation in an atmosphere having a hydrogen constituent that uses an operating environment that approximately maintains an interface trap density in the integrated circuit;

testing the integrated circuit to determine if any of the normal circuitry on the integrated circuit is defective;

replacing the defective normal circuitry on the integrated circuit with corresponding redundant circuitry; and thereafter subjecting the integrated circuit to a sufficient sinter operation in an atmosphere having a hydrogen constituent that uses an operating environment that causes a decrease in the interface trap density in the integrated circuit.

2. To the process of claim 1, wherein the insufficient sinter operation is carried out at a temperature that is less than 350° C.

3. The process of claim 2, wherein the sufficient sinter operation is carried out at a temperature in the range of 350° C.–500° C.

4. The process of claim 3, wherein the sufficient sinter operation is carried out at substantially 400° C.

5. The process of claim 1, wherein the integrated circuit comprises a dynamic random access memory.

6. The process of claim 1, wherein the insufficient sinter operation is carried out at a temperature that will not cause a substantial decrease in the interface trap density in the integrated circuit.

7. The process of claim 1, wherein the sufficient sinter operation is carried out at a temperature that is at a level that will cause a substantial decrease in the interface trap density.

* * * * *